US009806037B2

(12) United States Patent
Marchetto et al.

(10) Patent No.: US 9,806,037 B2
(45) Date of Patent: Oct. 31, 2017

(54) DEVICE FOR PREVENTION OF INTEGRATED CIRCUIT CHIP COUNTERFEITING

(71) Applicant: Cornell University, Ithaca, NY (US)

(72) Inventors: Peter Marchetto, Ithaca, NY (US); Raymond Mack, Cortland, NY (US)

(73) Assignee: Cornell University, Ithaca, NY (US)

( * ) Notice: Subject to any disclaimer, the term of this patent is extended or adjusted under 35 U.S.C. 154(b) by 0 days.

(21) Appl. No.: 15/039,133

(22) PCT Filed: Nov. 26, 2014

(86) PCT No.: PCT/US2014/067555
§ 371 (c)(1),
(2) Date: May 25, 2016

(87) PCT Pub. No.: WO2015/081163
PCT Pub. Date: Jun. 4, 2015

(65) Prior Publication Data

US 2017/0025366 A1 Jan. 26, 2017

Related U.S. Application Data

(60) Provisional application No. 61/909,478, filed on Nov. 27, 2013.

(51) Int. Cl.
*H01L 23/00* (2006.01)
*H01L 29/16* (2006.01)

(52) U.S. Cl.
CPC .......... *H01L 23/576* (2013.01); *H01L 23/573* (2013.01); *H01L 29/1608* (2013.01); *H01L 2924/0002* (2013.01)

(58) Field of Classification Search
None
See application file for complete search history.

(56) References Cited

U.S. PATENT DOCUMENTS 4,564,880 A 1/1986 Christ
4,571,492 A 2/1986 Kane
7,453,281 B2 11/2008 Anderson
2007/0271320 A1 11/2007 Tsuyuzaki
2008/0282208 A1 11/2008 Anderson
2013/0056257 A1* 3/2013 Chua .................. H05K 9/0088 174/388
2013/0285068 A1 10/2013 Heibel

OTHER PUBLICATIONS

Guin et al., Counterfeit Integrated Circuits: Detection, Avoidance, and the challenges ahead. J. Electron Test, DOI 10.1007/s10836-013-5430-8 (2014).

* cited by examiner

*Primary Examiner* — Whitney T Moore
(74) *Attorney, Agent, or Firm* — Valauskas Corder LLC

(57) ABSTRACT

A timer including a sensor and a radiation source is used to prevent counterfeiting of integrated circuits. The timer confirms the date code of the integrated circuit resulting in a more secure supply chain.

20 Claims, 2 Drawing Sheets

200
100
120
110
130
211
Radiation Count
215
Vcc
212
+ Input
216
Gain Control
213
- Input
217
Output
214
Gnd
218
Signal Monitor
223
222

DEVICE FOR PREVENTION OF INTEGRATED CIRCUIT CHIP COUNTERFEITING

CROSS-REFERENCE TO RELATED APPLICATIONS

This application claims the benefit of U.S. Provisional Patent Application No. 61/909,478 filed Nov. 27, 2013, which is incorporated by reference.

FIELD OF THE INVENTION

The invention relates generally to integrated circuit (IC) chips. More specifically, the invention relates to a timer device for use in IC chips to prevent counterfeiting.

BACKGROUND OF THE INVENTION

Integrated circuit (IC) chips are used in a variety of applications including security functions, government defense purposes, electronic devices and systems such as cellular telephones and gaming to name a few. Counterfeit IC chips may result in failures that are more than just inconvenient or a minor loss of money.

Counterfeiting of integrated circuit chips has become a major problem. Nearly every industry that relies on electronics for data communication, data management, and data processing has encountered counterfeit integrated circuits. A counterfeit IC chip may include an unauthorized copy, fails to conform to the original component manufacturer (OCM), or has incorrect or false identifying marks or documentation.

Counterfeit IC chips results in supply chain vulnerabilities. For example, counterfeit IC chips include those that are recycled and remarked, defective or out of specification, and cloned.

In certain circumstances, counterfeit IC chips may include additional logic capable of routing data including secure information such as credit card numbers, account numbers, and passwords from the IC chips into the the hands of an adverse party.

In order to counterfeit an IC chip, it is typically reverse engineered by processes such as delamination or delayering. The authentic IC chip is delayered one layer at a time and the circuit configuration of that particular layer is copied as a new schematic layout which can be used for manufacturing the counterfeit IC chip. Other reverse engineering techniques include the use of scanning electron microscopes (SEMs) and backside imaging.

Anti-counterfeiting detection methods exist in efforts to detect counterfeiting of IC chips and include, for example, X-ray, scanning electronic or imaging, or DNA marking. However, these anti-counterfeiting detection methods are complicated and time-consuming Thus, there is a need to prevent IC chip counterfeiting along with a simple and easy anti-counterfeiting detection method. The invention satisfies this need.

SUMMARY OF THE INVENTION

The invention prevents an integrated circuit (IC) chip from being counterfeited utilizing a timer device. The timer device comprises a radiation source component and a sensor component. For purposes of this application, the term integrated circuit chip includes microprocessors, memory chips including digital memory chips and application-specific integrated circuits (ASICs).

The timer device is integrated within the IC chip and configured to count down over time regardless of interference occurring outside the timer device. Using an independent timer device according to the invention, the date code stamped on the integrated circuit chip can be verified internally and any discrepancies noted.

In one embodiment, the device according to the invention is assembled within an integrated circuit chip. For example, the radiation source component and the sensor component may be laminated to one another and then covered with a radiation-proof shield to prevent spoofing by external sources. The timer device may be interfaced via a spare pin on the integrated circuit chip.

An advantage of the invention is that the timer device requires no moving parts. Furthermore, the radiation source component and the sensor component of the timer device are housed within a tamperproof case. Thus, the timer device is fully solid-state in that it is immune to shock and vibration.

Another advantage is that the timer device is easy to use in terms of anti-counterfeiting detection. According to the invention, complicated electrical testing or DNA sequencing is not necessary. The IC chip may be simply attached to a counter or a multimeter or voltmeter in order to read the voltage or counts, respectively, of the integrated circuit chip.

Yet another advantage is that the timer device does not require any external power.

The invention and its attributes and advantages will be further understood and appreciated with reference to the accompanying drawings.

BRIEF DESCRIPTION OF THE DRAWINGS

The preferred embodiments of the invention will be described in conjunction with the appended drawings provided to illustrate and not to the limit the invention, where like designations denote like elements, and in which.

DETAILED DESCRIPTION

Figure 1:
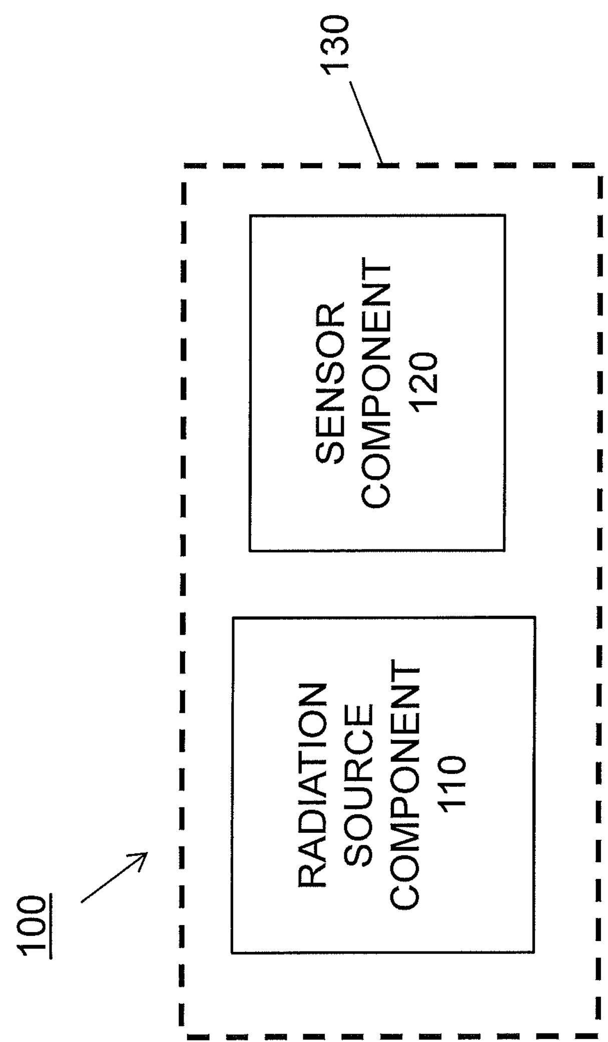
FIG. 1 illustrates a block diagram of an exemplary embodiment of the timer device according to the invention.

FIG. 1 illustrates a block diagram of an exemplary embodiment of the timer device 100 according to the invention. The timer device 100 includes a radiation source component 110 and a sensor component 120. As shown in FIG. 1, the radiation source component 110 and the sensor component 120 are encased by a radiation-proof shield 130. The timer device 100 is assembled within an integrated circuit chip 200 as shown in FIG. 2.

Figure 2:
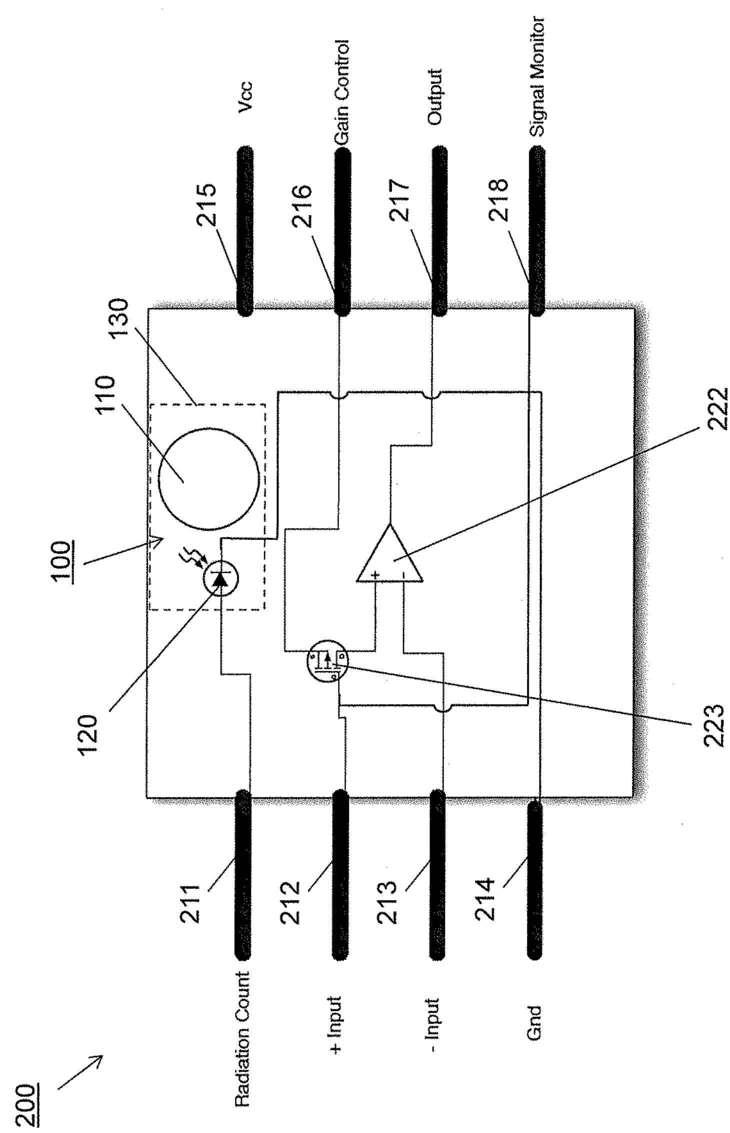
FIG. 2 illustrates a block diagram of an exemplary embodiment of an integrated circuit chip including timer device according to the invention.

FIG. 2 illustrates a block diagram of an exemplary embodiment of an integrated circuit chip 200. For exemplary purposes, the integrated circuit chip 200 is shown with a plurality of pins 211, 212, 213, 214, 215, 216, 217, 218. Specifically, a non-inverting input is applied to pin 212. An inverting input is applied to pin 213. Pin 214 is a ground power supply pin. Pin 215 is a positive power supply voltage pin. Pin 216 provides gain control. Pin 217 provides output—the difference between inputs of pin 212 and pin 213—amplified by an operational amplifier 222. As shown in FIG. 2, the integrated circuit chip 200 may include a logic gate 223 that controls the input of pin 212 based on the signal monitor of pin 218. The timer device 100 is interfaced via a spare pin (211) on the integrated circuit chip 200 to be protected against counterfeiting. Specifically, pin 211 provides the radiation count to the timer device 100.

In one embodiment, the radiation source component 110 and the sensor component 120 of the timer device 100 are laminated to one another and then covered with a radiation-proof shield 130 to prevent spoofing by external sources.

The radiation source component includes a radioactive substance with a known half-life. The radioactive substance is inserted into each integrated circuit chip during fabrication or packaging. More specifically, the radioactive substance may be an isotope such as a sodium isotope. In one embodiment the radioactive substance is sodium isotope $^{22}Na$, however any radioactive substance with a known half-life is contemplated.

In certain embodiment of the invention, an industry-standard activity level may be established such that an amount of an isotope with that level of activity is added to the IC chip on its date of packaging. For example, the activity level may be 1 microcurie (μCi).

The sensor component 120 is positioned next to the radiation source component 110 and detects radiation on the IC chip. In one embodiment, the sensor component 120 may be a biased conductor/insulator junction. In other embodiments, the sensor component 120 may be a silicon-carbide (SiC) diode.

The half-life of the radioactive substance is linked to the lifetime of the integrated circuit chip, such that if the sensor component 120 detects an activity level falling below a predetermined percentage of the standard level, the IC chip is determined "bad". For example, a bad IC chip may only be used in non-critical applications.

While the disclosure is susceptible to various modifications and alternative forms, specific exemplary embodiments of the invention have been shown by way of example in the drawings and have been described in detail. It should be understood, however, that there is no intent to limit the disclosure to the particular embodiments disclosed, but on the contrary, the intention is to cover all modifications, equivalents, and alternatives falling within the scope of the disclosure as defined by the appended claims.

The invention claimed is:

1. An integrated circuit chip to prevent counterfeiting, comprising:

a timer device comprising a radiation source component and a sensor component, wherein the sensor component detects an activity level of the radiation component to internally verify a date code stamped on the integrated circuit chip;

a radiation-proof shield covering both the radiation source component and the sensor component; and a counter or a multimeter or a voltmeter interfacing with the timer device via a spare pin of the integrated circuit chip.

2. The integrated circuit chip to prevent counterfeiting according to claim 1, wherein the radiation source component includes a radioactive substance with a known half-life.

3. The integrated circuit chip to prevent counterfeiting according to claim 2, wherein the known half-life of the radioactive substance is linked to a lifetime of the integrated circuit chip.

4. The integrated circuit chip to prevent counterfeiting according to claim 2, wherein the radioactive substance with a known half-life is a sodium isotope.

5. The integrated circuit chip to prevent counterfeiting according to claim 4, wherein the sodium isotope is 22Na.

6. The integrated circuit chip to prevent counterfeiting according to claim 1, wherein the sensor component is a biased conductor/insulator junction.

7. The integrated circuit chip to prevent counterfeiting according to claim 1, wherein the sensor component is a silicon-carbide (SiC) diode.

8. The integrated circuit chip to prevent counterfeiting according to claim 1 further comprising a logic gate controlling a noninverting input of a first pin based on a signal monitor of a third pin.

9. The integrated circuit chip to prevent counterfeiting according to claim 1 further comprising an amplifier amplifying a difference between a noninverting input of a first pin and an inverting input of a second pin.

10. The integrated circuit chip to prevent counterfeiting according to claim 1, wherein the activity level is 1 microcurie.

11. The integrated circuit chip to prevent counterfeiting according to claim 1, wherein the activity level is a percentage of an industry-standard activity level.

12. The integrated circuit chip to prevent counterfeiting according to claim 1, wherein the radiation source component and the sensor component are laminated to one another.

13. The integrated circuit chip to prevent counterfeiting according to claim 1, wherein the activity level is 1 microcurie.

14. An integrated circuit chip to prevent counterfeiting, comprising:

a timer device comprising a radiation source component and a sensor component, wherein the sensor component detects an activity level of the radiation component to internally verify a date code stamped on the integrated circuit chip;

a radiation-proof shield covering both the radiation source component and the sensor component;

a counter or a multimeter or a voltmeter interfacing with the timer device via a spare pin of the integrated circuit chip; and a logic gate controlling a noninverting input of a first pin based on a signal monitor of a third pin.

15. The integrated circuit chip to prevent counterfeiting according to claim 14, wherein the radiation source component includes a radioactive substance with a known half-life.

16. The integrated circuit chip to prevent counterfeiting according to claim 15, wherein the known half-life of the radioactive substance is linked to a lifetime of the integrated circuit chip.

17. The integrated circuit chip to prevent counterfeiting according to claim 15, wherein the radioactive substance with a known half-life is a sodium isotope.

18. The integrated circuit chip to prevent counterfeiting according to claim 14, wherein the sensor component is a biased conductor/insulator junction.

19. The integrated circuit chip to prevent counterfeiting according to claim 14 further comprising an amplifier amplifying a difference between the noninverting input of the first pin and an inverting input of a second pin.

20. The integrated circuit chip to prevent counterfeiting according to claim 14, wherein the radiation source component and the sensor component are laminated to one another.

* * * * *